US009673255B2

(12) United States Patent
Jo et al.

(10) Patent No.: US 9,673,255 B2
(45) Date of Patent: Jun. 6, 2017

(54) RESISTIVE MEMORY DEVICE AND FABRICATION METHODS

(71) Applicant: Crossbar, Inc., Santa Clara, CA (US)

(72) Inventors: Sung Hyun Jo, Sunnyvale, CA (US); Kuk-Hwan Kim, San Jose, CA (US); Tanmay Kumar, Pleasanton, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/597,151

(22) Filed: Jan. 14, 2015

(65) Prior Publication Data

US 2015/0144863 A1    May 28, 2015

Related U.S. Application Data

(62) Division of application No. 13/586,815, filed on Aug. 15, 2012, now Pat. No. 8,946,669.

(60) Provisional application No. 61/620,561, filed on Apr. 5, 2012.

(51) Int. Cl.
*H01L 27/04* (2006.01)
*H01L 27/24* (2006.01)
*H01L 45/00* (2006.01)

(52) U.S. Cl.
CPC ...... *H01L 27/2463* (2013.01); *H01L 27/2436* (2013.01); *H01L 45/08* (2013.01); *H01L 45/085* (2013.01); *H01L 45/1233* (2013.01); *H01L 45/1253* (2013.01); *H01L 45/145* (2013.01); *H01L 45/148* (2013.01); *H01L 45/1633* (2013.01); *H01L 45/1675* (2013.01)

(58) Field of Classification Search
CPC .... H01L 27/2436; H01L 45/04; H01L 45/145
See application file for complete search history.

(56) References Cited

U.S. PATENT DOCUMENTS

| 680,652 A | 8/1901 | Elden |
| 4,433,468 A | 2/1984 | Kawamata |
| 4,684,972 A | 8/1987 | Owen et al. |

(Continued)

FOREIGN PATENT DOCUMENTS

| CN | 101131872 A | 2/2008 |
| CN | 101170132 A | 4/2008 |

(Continued)

OTHER PUBLICATIONS

Jian Hu et al., "Area-Dependent Switching In Thin Film-Silicon Devices", Materials Research Society, Mal. Res. Soc. Symp Proc., 2003, pp. A18.3.1-A18.3.6, vol. 762.

(Continued)

*Primary Examiner* — Kimberly Rizkallah
*Assistant Examiner* — Maria Ligai
(74) *Attorney, Agent, or Firm* — Amin, Turocy & Watson, LLP (57) ABSTRACT

A method for forming a resistive memory device includes providing a substrate comprising a first metal material, forming a conductive silicon-bearing layer on top of the first metal material, wherein the conductive silicon-bearing layer comprises an upper region and a lower region, and wherein the lower region is adjacent to the first metal material, forming an amorphous layer from the upper region of the conductive silicon-bearing layer, and disposing an active metal material above the amorphous layer.

20 Claims, 3 Drawing Sheets

(56) References Cited

U.S. PATENT DOCUMENTS

| | | | |
|---|---|---|---|
| 4,741,601 | A | 5/1988 | Saito |
| 4,994,866 | A | 2/1991 | Awano |
| 5,139,911 | A | 8/1992 | Yagi et al. |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |
| 5,457,649 | A | 10/1995 | Eichman et al. |
| 5,499,208 | A | 3/1996 | Shoji |
| 5,538,564 | A | 7/1996 | Kaschmitter |
| 5,541,869 | A | 7/1996 | Rose et al. |
| 5,594,363 | A | 1/1997 | Freeman et al. |
| 5,596,214 | A | 1/1997 | Endo |
| 5,614,756 | A | 3/1997 | Forouhi et al. |
| 5,627,451 | A | 5/1997 | Takeda |
| 5,645,628 | A | 7/1997 | Endo et al. |
| 5,673,223 | A | 9/1997 | Park |
| 5,707,487 | A | 1/1998 | Hori et al. |
| 5,714,416 | A | 2/1998 | Eichman et al. |
| 5,751,012 | A | 5/1998 | Wolstenholme et al. |
| 5,763,898 | A | 6/1998 | Forouhi et al. |
| 5,840,608 | A | 11/1998 | Chang |
| 5,923,587 | A | 7/1999 | Choi |
| 5,970,332 | A | 10/1999 | Pruijmboom et al. |
| 5,973,335 | A | 10/1999 | Shannon |
| 5,998,244 | A | 12/1999 | Wolstenholme et al. |
| 6,002,268 | A | 12/1999 | Sasaki et al. |
| 6,037,204 | A | 3/2000 | Chang et al. |
| 6,122,318 | A | 9/2000 | Yamaguchi et al. |
| 6,128,214 | A | 10/2000 | Kuekes et al. |
| 6,143,642 | A | 11/2000 | Sur, Jr. et al. |
| 6,180,998 | B1 | 1/2001 | Crafts |
| 6,181,587 | B1 | 1/2001 | Kuramoto et al. |
| 6,181,597 | B1 | 1/2001 | Nachumovsky |
| 6,259,116 | B1 | 7/2001 | Shannon |
| 6,288,435 | B1 | 9/2001 | Mei et al. |
| 6,291,836 | B1 | 9/2001 | Kramer et al. |
| 6,436,765 | B1 | 8/2002 | Liou et al. |
| 6,436,818 | B1 | 8/2002 | Hu et al. |
| 6,492,694 | B2 | 12/2002 | Noble et al. |
| 6,552,932 | B1 | 4/2003 | Cernea |
| 6,627,530 | B2 | 9/2003 | Li et al. |
| 6,724,186 | B2 | 4/2004 | Jordil |
| 6,731,535 | B1 | 5/2004 | Ooishi et al. |
| 6,740,921 | B2 | 5/2004 | Matsuoka et al. |
| 6,762,474 | B1 | 7/2004 | Mills, Jr. |
| 6,768,157 | B2 | 7/2004 | Krieger et al. |
| 6,815,286 | B2 | 11/2004 | Krieger et al. |
| 6,816,405 | B1 | 11/2004 | Lu et al. |
| 6,821,879 | B2 | 11/2004 | Wong |
| 6,838,720 | B2 | 1/2005 | Krieger et al. |
| 6,848,012 | B2 | 1/2005 | LeBlanc et al. |
| 6,849,891 | B1 | 2/2005 | Hsu et al. |
| 6,858,481 | B2 | 2/2005 | Krieger et al. |
| 6,858,482 | B2 | 2/2005 | Gilton |
| 6,864,127 | B2 | 3/2005 | Yamazaki et al. |
| 6,864,522 | B2 | 3/2005 | Krieger et al. |
| 6,867,618 | B2 | 3/2005 | Li |
| 6,881,994 | B2 | 4/2005 | Lee et al. |
| 6,897,519 | B1 | 5/2005 | Dosluoglu |
| 6,927,430 | B2 | 8/2005 | Hsu |
| 6,939,787 | B2 | 9/2005 | Ohtake et al. |
| 6,946,719 | B2 | 9/2005 | Petti et al. |
| 7,020,006 | B2 | 3/2006 | Chevallier et al. |
| 7,023,093 | B2 | 4/2006 | Canaperi et al. |
| 7,026,702 | B2 | 4/2006 | Krieger et al. |
| 7,087,454 | B2 | 8/2006 | Campbell et al. |
| 7,102,150 | B2 | 9/2006 | Harshfield et al. |
| 7,122,853 | B1 | 10/2006 | Gaun et al. |
| 7,167,387 | B2 | 1/2007 | Sugita et al. |
| 7,187,577 | B1 | 3/2007 | Wang et al. |
| 7,221,599 | B1 | 5/2007 | Gaun et al. |
| 7,238,607 | B2 | 7/2007 | Dunton et al. |
| 7,238,994 | B2 | 7/2007 | Chen et al. |
| 7,251,152 | B2 | 7/2007 | Roehr |
| 7,254,053 | B2 | 8/2007 | Krieger et al. |
| 7,274,587 | B2 | 9/2007 | Yasuda |
| 7,289,353 | B2 | 10/2007 | Spitzer et al. |
| 7,324,363 | B2 | 1/2008 | Kerns et al. |
| 7,345,907 | B2 | 3/2008 | Scheuerlein |
| 7,365,411 | B2 | 4/2008 | Campbell |
| 7,405,418 | B2 | 7/2008 | Happ et al. |
| 7,426,128 | B2 | 9/2008 | Scheuerlein |
| 7,433,253 | B2 | 10/2008 | Gogl et al. |
| 7,474,000 | B2 | 1/2009 | Scheuerlein et al. |
| 7,479,650 | B2 | 1/2009 | Gilton |
| 7,499,355 | B2 | 3/2009 | Scheuerlein et al. |
| 7,515,454 | B2 | 4/2009 | Symanczyk |
| 7,521,705 | B2 | 4/2009 | Liu |
| 7,534,625 | B2 | 5/2009 | Karpov et al. |
| 7,541,252 | B2 | 6/2009 | Eun et al. |
| 7,550,380 | B2 | 6/2009 | Elkins et al. |
| 7,561,461 | B2 | 7/2009 | Nagai et al. |
| 7,566,643 | B2 | 7/2009 | Czubatyj et al. |
| 7,606,059 | B2 | 10/2009 | Toda |
| 7,615,439 | B1 | 11/2009 | Schricker et al. |
| 7,629,198 | B2 | 12/2009 | Kumar et al. |
| 7,667,442 | B2 | 2/2010 | Itoh |
| 7,692,959 | B2 | 4/2010 | Krusin-Elbaum et al. |
| 7,704,788 | B2 | 4/2010 | Youn et al. |
| 7,719,001 | B2 | 5/2010 | Nomura et al. |
| 7,728,318 | B2 | 6/2010 | Raghuram et al. |
| 7,729,158 | B2 | 6/2010 | Toda et al. |
| 7,746,601 | B2 | 6/2010 | Sugiyama et al. |
| 7,746,696 | B1 | 6/2010 | Paak |
| 7,749,805 | B2 | 7/2010 | Pinnow et al. |
| 7,764,536 | B2 | 7/2010 | Luo et al. |
| 7,772,581 | B2 | 8/2010 | Lung |
| 7,776,682 | B1 | 8/2010 | Nickel et al. |
| 7,778,063 | B2 | 8/2010 | Brubaker et al. |
| 7,786,464 | B2 | 8/2010 | Nirschl et al. |
| 7,786,589 | B2 | 8/2010 | Matsunaga et al. |
| 7,791,060 | B2 | 9/2010 | Aochi et al. |
| 7,824,956 | B2 | 11/2010 | Schricker et al. |
| 7,829,875 | B2 | 11/2010 | Scheuerlein |
| 7,830,698 | B2 | 11/2010 | Chen et al. |
| 7,835,170 | B2 | 11/2010 | Bertin et al. |
| 7,858,468 | B2 | 12/2010 | Liu et al. |
| 7,859,884 | B2 | 12/2010 | Scheuerlein |
| 7,869,253 | B2 | 1/2011 | Liaw et al. |
| 7,875,871 | B2 | 1/2011 | Kumar et al. |
| 7,881,097 | B2 | 2/2011 | Hosomi et al. |
| 7,883,964 | B2 | 2/2011 | Goda et al. |
| 7,897,953 | B2 | 3/2011 | Liu |
| 7,898,838 | B2 | 3/2011 | Chen et al. |
| 7,920,412 | B2 | 4/2011 | Hosotani et al. |
| 7,924,138 | B2 | 4/2011 | Kinoshita et al. |
| 7,927,472 | B2 | 4/2011 | Takahashi et al. |
| 7,968,419 | B2 | 6/2011 | Li et al. |
| 7,972,897 | B2 | 7/2011 | Kumar et al. |
| 7,984,776 | B2 | 7/2011 | Sastry et al. |
| 8,004,882 | B2 | 8/2011 | Katti et al. |
| 8,018,760 | B2 | 9/2011 | Muraoka et al. |
| 8,021,897 | B2 | 9/2011 | Sills et al. |
| 8,045,364 | B2 | 10/2011 | Schloss et al. |
| 8,054,674 | B2 | 11/2011 | Tamai et al. |
| 8,054,679 | B2 | 11/2011 | Nakai et al. |
| 8,067,815 | B2 | 11/2011 | Chien et al. |
| 8,071,972 | B2 | 12/2011 | Lu et al. |
| 8,084,830 | B2 | 12/2011 | Kanno et al. |
| 8,088,688 | B1 | 1/2012 | Herner |
| 8,097,874 | B2 | 1/2012 | Venkatasamy et al. |
| 8,102,018 | B2 | 1/2012 | Bertin et al. |
| 8,102,698 | B2 | 1/2012 | Scheuerlein |
| 8,143,092 | B2 | 3/2012 | Kumar et al. |
| 8,144,498 | B2 | 3/2012 | Kumar et al. |
| 8,164,948 | B2 | 4/2012 | Katti et al. |
| 8,168,506 | B2 | 5/2012 | Herner |
| 8,183,553 | B2 | 5/2012 | Phatak et al. |
| 8,187,945 | B2 | 5/2012 | Herner |
| 8,198,144 | B2 | 6/2012 | Herner |
| 8,207,064 | B2 | 6/2012 | Bandyopadhyay et al. |
| 8,227,787 | B2 | 7/2012 | Kumar et al. |

(56) References Cited

U.S. PATENT DOCUMENTS

| | | |
|---|---|---|
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0162881 A1 | 7/2005 | Stasiak et al. |
| 2005/0175099 A1 | 8/2005 | Sarkijarvi et al. |
| 2006/0017488 A1 | 1/2006 | Hsu |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1* | 9/2006 | Baek ............ G11C 11/16 365/158 |
| 2006/0231910 A1 | 10/2006 | Hsieh et al. |
| 2006/0246606 A1 | 11/2006 | Hsu et al. |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |

(56) References Cited

U.S. PATENT DOCUMENTS

| | | |
|---|---|---|
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1* | 8/2011 | Nam ............... H01L 45/085 257/4 |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1* | 3/2012 | Jo ............... H01L 45/085 257/379 |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1* | 3/2013 | Li ............... G11C 13/0002 257/3 |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |

(56) References Cited

U.S. PATENT DOCUMENTS

| | | |
|---|---|---|
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2016/0111640 A1 | 4/2016 | Chang et al. |

FOREIGN PATENT DOCUMENTS

| | | |
|---|---|---|
| CN | 101501850 A | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| JP | 2008503085 A | 1/2008 |
| JP | 2008147343 A | 6/2008 |
| JP | 2009043873 A | 2/2009 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 20090051206 A | 5/2009 |
| KR | 1020110014248 A | 2/2011 |
| TW | 382820 B | 2/2000 |
| TW | 434887 B | 5/2001 |
| TW | 476962 B | 2/2002 |
| TW | 200625635 A | 7/2006 |
| WO | WO 03/034498 A1 | 4/2003 |
| WO | 2005124787 A2 | 12/2005 |
| WO | WO 2009/005699 A1 | 1/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | WO 2011/133138 A1 | 10/2011 |

OTHER PUBLICATIONS

AndréDehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", INT. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

(56) References Cited

OTHER PUBLICATIONS

Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p+ a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A.J. Holmes et al., "Design of Analogue Synapse Circuits using Non-Volatile a-Si:H Memory Devices", pp. 351-354.

Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñéet al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.

(56) References Cited

OTHER PUBLICATIONS

Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/705,082, dated Sep. 2, 2014.
Notice of Allowance for U.S. Appl. No. 13/761,132, dated Sep. 4, 2014.
Notice of Allowance for U.S. Appl. No. 13/620,012, dated Sep. 9, 2014.
Notice of Allowance for U.S. Appl. No. 13/870,919, dated Sep. 9, 2014.
Office Action for U.S. Appl. No. 13/739,283, dated Sep. 11, 2014.
Office Action for U.S. Appl. No. 13/756,498, dated Sep. 12, 2014.
Notice of Allowance for U.S. Appl. No. 13/462,653 dated Sep. 17, 2014.
Notice of Allowance for U.S. Appl. No. 13/586,815, dated Sep. 18, 2014.
Notice of Allowance for U.S. Appl. No. 13/920,021, dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,941, dated Oct. 8, 2014.
Notice of Allowance for U.S. Appl. No. 13/077,941, dated Aug. 27, 2014.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action mailed Apr. 1, 2013 for U.S. Appl. No. 13/174,077, filed Jun. 30, 2011.
Office Action mailed Oct. 3, 2013 for U.S. Appl. No. 13/921,157, filed Jun. 18, 2013.
Office Action mailed Apr. 6, 2015 for U.S. Appl. No. 14/034,390, filed Sep. 23, 2013.
Office Action mailed Dec. 6, 2013 for U.S Appl. No. 13/564,639, filed Aug. 1, 2012.
Office Action mailed Dec. 6, 2013 for U.S. Appl. No. 13/960,735, filed Aug. 6, 2013.
Office Action mailed Dec. 7, 2012 for U.S Appl. No. 13/436,714, filed Mar. 30, 2012.
Office Action mailed Mar. 7, 2013 for U.S. Appl. No. 13/651,169, filed Oct. 12, 2012.
Office Action mailed May 7, 2013 for U.S. Appl. No. 13/585,759, filed Aug. 14, 2012.
Shin W., et al., "Effect of Native Oxide on Polycrystalline Silicon CMP," Journal of the Korean Physical Society, 2009, vol. 54 (3), pp. 1077-1081.
Office Action mailed Aug. 9, 2013 for U.S. Appl. No. 13/764,710, filed Feb. 11, 2013.
Office Action mailed Jul. 9, 2013 for U.S. Appl. No. 13/447,036, filed Apr. 13, 2012.
Office Action mailed Jul. 9, 2014 for U.S. Appl. No. 14/166,691, filed Jan. 28, 2014.
Office Action mailed Oct. 9, 2012 for U.S. Appl. No. 13/417,135, filed Mar. 9, 2012.
Office Action mailed Apr. 11, 2014 for U.S. Appl. No. 13/143,047, filed Jun. 30, 2011.

(56) References Cited

OTHER PUBLICATIONS

Office Action mailed Jul. 11, 2013 for U.S. Appl. No. 13/764,698, filed Feb. 11, 2013.
Office Action mailed Sep. 12, 2014 for U.S. Appl. No. 13/426,869, filed Mar. 22, 2012.
Office Action mailed Dec. 3, 2015 for U.S. Appl. No. 14/253,796.
Office Action mailed Feb. 13, 2014 for U.S. Appl. No. 13/174,077, filed Jun. 30, 2011.
Office Action mailed Mar. 14, 2012 for U.S. Appl. No. 12/815,369, filed Jun. 14, 2010.
Office Action mailed Apr. 16, 2012 for U.S. Appl. No. 12/834,610, filed Jul. 12, 2010.
Office Action mailed May 16, 2012 for U.S. Appl. No. 12/815,318, filed Jun. 14, 2010.
Office Action mailed Oct. 16, 2012 for U.S. Appl. No. 12/861,650, filed Aug. 23, 2010.
Office Action mailed Feb. 17, 2011 for U.S. Appl. No. 12/913,719, filed Oct. 27, 2010.
Office Action mailed Jun. 17, 2014 for U.S. Appl. No. 14/072,657, filed Nov. 5, 2013.
Office Action mailed Mar. 17, 2015 for U.S. Appl. No. 14/573,770.
Office Action mailed Apr. 8, 2016 for U.S. Appl. No. 14/573,770.
Office Action mailed Aug. 19, 2013 for U.S. Appl. No. 13/585,759, filed Aug. 14, 2012.
Office Action mailed Jun. 19, 2012 for U.S. Appl. No. 13/149,757, filed May 31, 2011.
Office Action mailed Mar. 19, 2013 for U.S. Appl. No. 13/564,639, filed Aug. 1, 2012.
Office Action mailed Nov. 20, 2012 for U.S. Appl. No. 13/149,653, filed May 31, 2011.
Office Action mailed Sep. 20, 2013 for U.S. Appl. No. 13/481,600, filed May 25, 2012.
Office Action mailed Mar. 21, 2014 for U.S. Appl. No. 13/447,036, filed Apr. 13, 2012.
Office Action mailed May 21, 2014 for U.S. Appl. No. 13/764,698, filed Feb. 11, 2013.
Office Action mailed Jul. 22, 2011 for U.S. Appl. No. 12/913,719, filed Oct. 27, 2010.
Office Action mailed May 23, 2013 for U.S. Appl. No. 13/592,224, filed Aug. 22, 2012.
Office Action mailed Apr. 25, 2014 for U.S. Appl. No. 13/761,132, filed Feb. 6, 2013.
Office Action mailed Oct. 25, 2012 for U.S. Appl. No. 13/461,725, filed May 1, 2012.
Office Action mailed Sep. 25, 2013 for U.S. Appl. No. 13/194,479, filed Jul. 29, 2011.
Office Action mailed Nov. 26, 2012 for U.S Appl. No. 13/156,232.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Jan. 11, 2016 for U.S. Appl. No. 14/613,299.
Notice of Allowance mailed Mar. 12, 2012 for U.S. Appl. No. 12/913,719, filed Oct. 27, 2010.
Notice of Allowance mailed Jan. 20, 2016 for U.S. Appl. No. 14/034,390.
Notice of Allowance mailed Nov. 13, 2013 for U.S. Appl. No. 13/461,725, filed May 1, 2012.
Notice of Allowance mailed Nov. 14, 2012 for U.S. Appl. No. 12/861,666, filed Aug. 23, 2010.
Notice of Allowance mailed Nov. 14, 2012 for U.S. Appl. No. 13/532,019, filed Jun. 25, 2012.
Notice of Allowance mailed Jan. 16, 2014 for U.S. Appl. No. 13/921,157, filed Jun. 18, 2013.
Notice of Allowance mailed Mar. 17, 2014 for U.S. Appl. No. 13/592,224, filed Aug. 22, 2012.
Notice of Allowance mailed May 17, 2013 for U.S. Appl. No. 13/290,024.
Notice of Allowance mailed Sep. 17, 2014 for U.S. Appl. No. 13/960,735, filed Aug. 6, 2013.
Notice of Allowance mailed Sep. 18, 2012 for U.S. Appl. No. 12/900,232, filed Oct. 7, 2010.
Notice of Allowance mailed Sep. 19, 2013 for U.S. Appl. No. 13/585,759, filed Aug. 14, 2012.
Notice of Allowance mailed Apr. 2, 2013 for U.S. Appl. No. 13/149,757, filed May 31, 2011.
Notice of Allowance mailed Mar. 20, 2014 for U.S. Appl. No. 13/598,550, filed Aug. 29, 2012.
Notice of Allowance mailed Mar. 20, 2014 for U.S. Appl. No. 13/461,725, filed May 1, 2012.
Notice of Allowance mailed Oct. 21, 2014 for U.S. Appl. No. 13/426,869, filed Mar. 22, 2012.
Notice of Allowance mailed Feb. 10, 2015 for U.S. Appl. No. 13/525,096, filed Jun. 15, 2012.
Notice of Allowance mailed May 22, 2012 for U.S. Appl. No. 12/815,369, filed Jun. 14, 2010.
Notice of Allowance mailed Dec. 23, 2015 for U.S. Appl. No. 14/573,770.
Notice of Allowance mailed Oct. 25, 2012 for U.S. Appl. No. 12/894,087, filed Sep. 29, 2010.
Notice of Allowance mailed Sep. 25, 2014 for U.S. Appl. No. 13/447,036, filed Apr. 13, 2012.
Notice of Allowance mailed Nov. 28, 2012 for U.S. Appl. No. 13/290,024, filed Nov. 4, 2011.
Notice of Allowance mailed Oct. 28, 2013 for U.S. Appl. No. 13/194,500, filed Jul. 29, 2011.
Notice of Allowance mailed Oct. 28, 2013 for U.S. Appl. No. 13/651,169, filed Oct. 12, 2012.
Notice of Allowance mailed Oct. 29, 2012 for U.S. Appl. No. 13/149,807, filed May 31, 2011.
Notice of Allowance mailed Nov. 29, 2012 for U.S. Appl. No. 12/815,318, filed Jun. 14, 2010.
Notice of Allowance mailed Sep. 30, 2013 for U.S. Appl. No. 13/481,696, filed May 25, 2012.
Notice of Allowance mailed Aug. 31, 2012 for U.S. Appl. No. 13/051,296, filed Mar. 18, 2011.
Notice of Allowance mailed Apr. 20, 2016 for U.S. Appl. No. 14/573,817.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for European Application No. 11005649.6 dated Dec. 1, 2014, 2 pages.
Office Action for European Application No. 11005649.6 dated Nov. 17, 2015, 5 pages.
European Office Action for Application No. EP11005207.3 dated Aug. 8, 2012, 4 pages.
Office Action mailed Jul. 12, 2012 for U.S. Appl. No. 13/463,714, filed May 3, 2012.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.

(56) References Cited

OTHER PUBLICATIONS

Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action mailed Dec. 27, 2013 for U.S. Appl. No. 13/525,096, filed Jun. 15, 2012.
Office Action mailed Jul. 30, 2012 for U.S. Appl. No. 12/900,232, filed Oct. 7, 2010.
Office Action mailed Jun. 30, 2014 for U.S. Appl. No. 13/531,449, filed Jun. 22, 2012.
Written Opinion for Application No. PCT/US2011/046036, mailed on Feb. 23, 2012, 4 pages.
Office Action mailed May 20, 2016 for U.S. Appl. No. 14/613,299.
Office Action mailed Jul. 9, 2015 for U.S. Appl. No. 14/573,817.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No 201110195933.7 dated Jul. 31, 2014, 4 pages.
Chinese Office Action (English Translation) for Chinese Application No 201110195933.7 dated May 18, 2015, 4 pages.
Chinese Office Action (English Translation) for Chinese Application No 201180050941.0 dated Dec. 9, 2015, 5 pages.
Chinese Office Action (with English Translation) for Chinese Application No. 201280027066.9 mailed on Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
European Search Report for Application No. EP14000949, mailed on Jun. 4, 2014, 7 pages.
European Search Report for European Application No. EP11005649 mailed Oct. 15, 2014, 2 pages.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Notice of Allowance dated Aug. 28, 2015 for U.S. Appl. No. 14/573,770, 23 pages.
Hu X.Y., et al., "Write Amplification Analysis in Flash-based Solid State Drives", SYSTOR'09; 20090504-20090406, May 4, 2009, pp. 1-9.
International Search Report and Written Opinion for Application No. PCT/US2011/040362, mailed on Jan. 19, 2012, 7 pages.
International Search Report and Written Opinion for Application No. PCT/US2012/040232, mailed on Feb. 26, 2013, 7 pages.
International Search Report and Written Opinion for Application No. PCT/US2012/044077, mailed on Jan. 25, 2013, 9 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report for Application No. PCT/US2011/046036, mailed on Feb. 23, 2012, 3 pages.
Notice of Allowance for U.S. Appl. No. 13/952,467 dated May 20, 2016, 19 pages.
Office Action mailed Mar. 13, 2012 for U.S. Appl. No. 12/625,817, filed Nov. 25, 2009.
Japanese Office Action (English Translation) for Japanese Application No. 2011-153349 mailed Feb. 24, 2015, 3 pages.
Japanese Office Action (English Translation) for Japanese Application No. 2013-525926 mailed Mar. 3, 2015, 4 pages.
Japanese Office Action (English Translation) for Japanese Application no. 2014-513700 mailed Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 13/912,136 dated Aug. 3, 2015, 15 pages.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Notice of Allowance for U.S. Appl. No. 14/692,677 dated Nov. 21, 2016, 97 pages.
corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.

(56) References Cited

OTHER PUBLICATIONS

Notice of Allowance dated Oct. 7, 2016 for U.S. Appl. No. 14/213,953, 43 pages.
Notice of Allowance for U.S. Appl. No. 14/509,967 dated Oct. 24, 2016, 42 pages.
Notice of Allowance for U.S. Appl. No. 14/383,079 dated Aug. 17, 2016, 71 pages.
Notice of Allowance for U.S. Appl. No. 14/611,022 dated Oct. 26, 2016, 41 pages.
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S. Appl. No. 14/597,151 dated Oct. 20, 2016, 52 pages.
Office Action for U.S. Appl. No. 14/588,136 dated Nov. 2, 2016, 132 pages.
Taiwanese Office Action mailed on Dec. 6, 2016 for Taiwanese Application No. 102129266, 7 pages (with English translation).
Office Action for U.S. Appl. No. 14/667,346 dated Feb. 9, 2017, 29 pages.
Chinese Office Action for Chinese Application Serial No. 201280027066.9 dated Feb. 17, 2017, 9 pages. (with English translation).

\* cited by examiner

RESISTIVE MEMORY DEVICE AND FABRICATION METHODS

CROSS-REFERENCE TO RELATED CASES

The present invention claims priority to and is a divisional of U.S. patent Ser. No. 13/586,815, filed on Aug. 15, 2012, which is a non-provisional of Ser. No. 61/620,561, filed Apr. 5, 2012. These applications are herein by incorporated by reference for all purposes.

BACKGROUND

The present invention relates to memory devices. More particularly, the present invention discloses non-volatile resistive switch memory devices having improved operational characteristics, fabrication techniques, as well as apparatus including such memories.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention relates to memory devices. More particularly, embodiments according to the present invention disclose memory (e.g. switching) devices having improved data retention characteristics and methods for forming such devices. Embodiments are described with respect to non-volatile memory devices, however, embodiments may also be applied to a broader range of memory devices, processing devices, and the like.

Various processes include fabrication of a resistive memory device. One process includes forming a conductive silicon layer, such as a p-doped polysilicon or silicon/germanium alloy, in electrical contact and above a first metal layer (e.g. aluminum). The conductive silicon layer is then subject to a plasma etch or ion implantation step (e.g. Argon, Oxygen, Silicon), that changes an upper region of the conductive silicon layer into an amorphous layer. The non-conductive amorphous layer may include oxygen, non-crystalline silicon, silicon dioxide, and p-type impurities, but is relatively non-conductive.

In some specific examples, when the conductive silicon layer is a doped polysilicon material, the amorphization process creates an amorphous material, such as SiOx as a resistive switching layer. In other specific examples, when the conductive silicon layer is a doped silicon-germanium material, the amorphization process creates a SixGeyOz (x, y, z integers) material as a resistive switching material. In some examples, the resulting resistive switching material may have a thickness in the range of approximately 2 nm to approximately 5 nm. In other embodiments, other thicknesses are contemplated, in light of the specific engineering requirements.

Subsequently, an active metal layer (e.g. silver, platinum, palladium, copper, nickel, or the like) is disposed above the upper region (now amorphous layer). One or more second metal layers (e.g. aluminum) may be formed in electrical contact with the active metal layer. A resistive memory device is formed from a lower region of the conductive silicon layer, the non-conductive amorphous layer, and the active metal layer.

In various embodiments, a processor, or the like, may include resistive memories as described herein. Because the resistive memories are relatively non-volatile, the resistive states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

According to one aspect of the invention, a semiconductor fabrication method for forming a resistive memory device is disclosed. One technique includes providing a substrate comprising a first metal material, and forming a conductive silicon-bearing layer on top of the first metal material, wherein the conductive silicon-bearing layer comprises an upper region and a lower region, and wherein the lower region is adjacent to the first metal material. A process includes forming an amorphous layer from the upper region of the conductive silicon-bearing layer, and disposing an active metal material above the amorphous layer.

According to another aspect of the invention, a resistive memory device is described. One device includes a substrate comprising a first metal material, and a monolithic semiconductor layer formed on the first metal material, wherein the monolithic semiconductor layer comprises an upper region and a lower region, wherein the lower region of the monolithic semiconductor layer comprises a conductive silicon-bearing material, and wherein the upper region of the monolithic semiconductor layer comprises a conductive silicon-bearing material subjected to an Argon plasma etch, and wherein the lower region is adjacent to the first metal material. In a device an active metal material disposed above the upper region.

According to yet another aspect of the invention, a resistive memory device formed according to the processes disclosed herein.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is generally related to a memory (switching) device and an apparatus including a memory device. More particularly, embodiments of the present invention provide structures and methods for forming one or more resistive switching/memory devices each having improved memory retention characteristics. The embodiments described herein are described with respect to fabrication of high density non-volatile memory devices. However, one of ordinary skill in the art will recognize that these devices may be applied to a broad range of applications, such as processing devices, computing devices, or the like.

Figure 1:
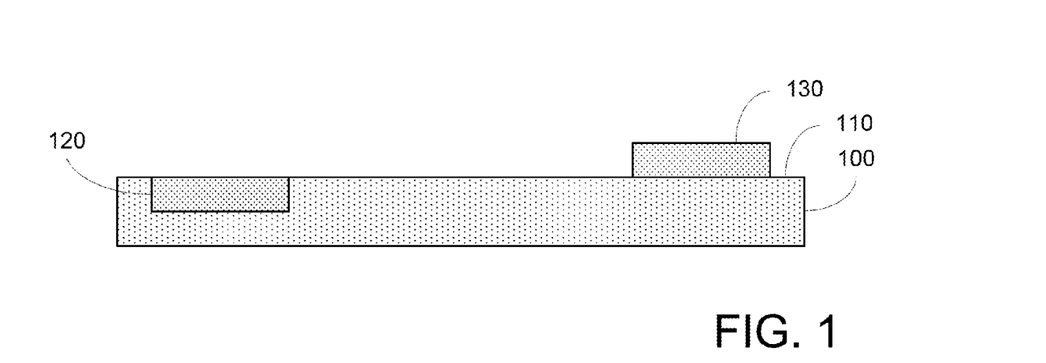
FIG. 1 illustrates a cross-section of a process step for forming a switching device according to various embodiments of the present invention.

FIG. 1 illustrates a substrate 100 having a surface region 110. In various embodiments, the substrate 100 can be a semiconductor substrate, such as: a single crystal silicon wafer, a silicon germanium wafer, a silicon-on-insulator substrate, commonly known as SOI, and the like.

Depending on the specific embodiment, the processes described herein are back-end CMOS processes, i.e. processes limited to certain temperature ranges, and the like, that can be performed upon substrates having existing CMOS devices. Accordingly, the substrate 100 may include one or more transistor devices, conductors, or the like, formed below (e.g. 120) surface region 110, or next to surface region 110 (e.g. 130). In some embodiments, the CMOS devices 120 or 130 may include device drivers controlling circuitry for the resistive switching device; processing or computational logic; physical sensors; memories, or the like. In various embodiments, the one or more resistive switching/memory devices formed herein may be operationally coupled to the CMOS devices 120 or 130.

Figure 2:
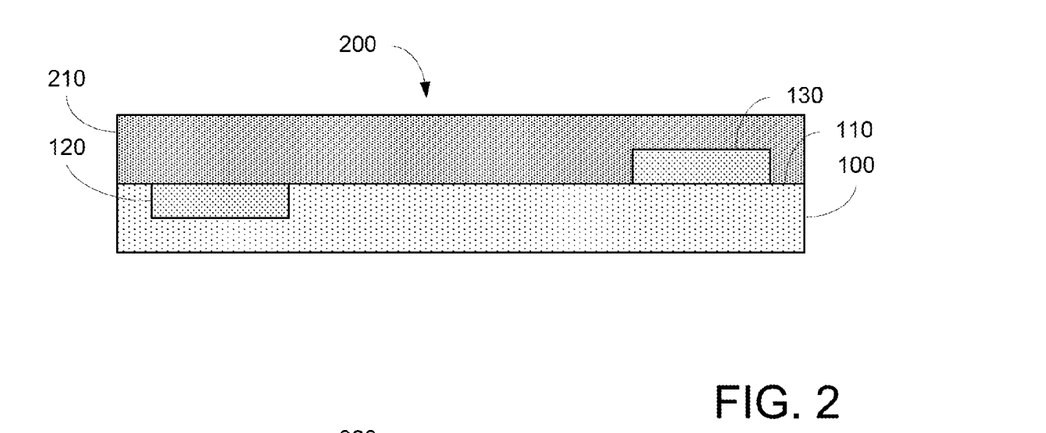
FIG. 2 illustrates a cross-section of process step for forming a switching device according to various embodiments of the present invention.

FIG. 2 illustrates a resulting cross-section 200 after a first dielectric material 210 is disposed overlying the surface region 110 of the semiconductor substrate 100. The first dielectric material 210 can be a suitable dielectric material such as silicon oxide, silicon nitride or combinations thereof depending on the embodiment. In various embodiments, the first dielectric material 210 can be deposited using conventional processing techniques such as plasma enhanced chemical vapor deposition; low pressure chemical vapor deposition; or the like depending on engineering requirements. In some examples, silicon oxide may be formed using silane, disilane, a suitable chlorosilane or TEOS, or other suitable silicon bearing materials, depending on the embodiment.

Figure 3:
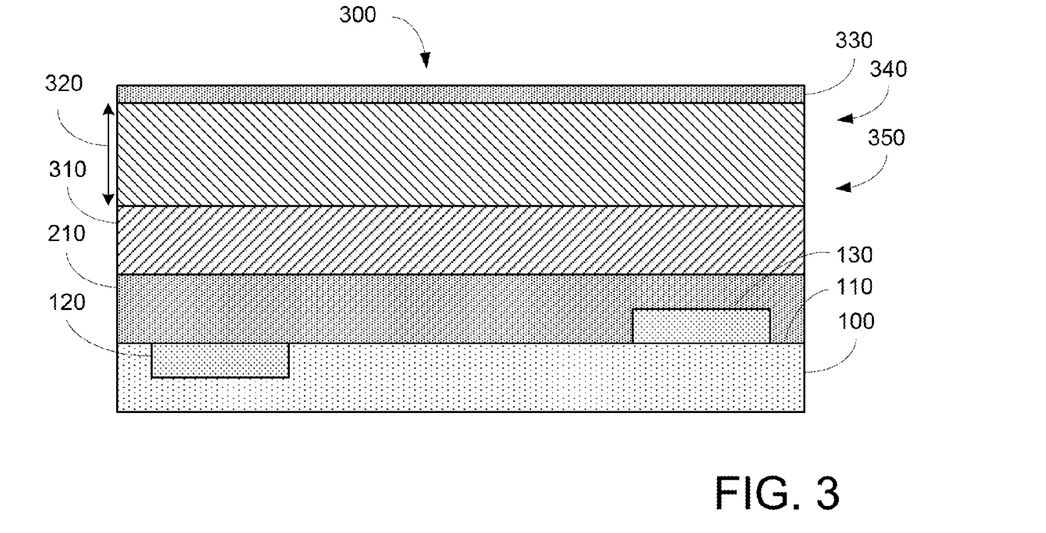
FIG. 3 illustrates a cross-section of a process step for forming a switching device according to various embodiments of the present invention.

FIG. 3 illustrates a cross-section 300 after a first wiring material 310 is disposed overlying the first dielectric material 210. In various embodiments, the first wiring material 310 may be tungsten, copper, aluminum or other suitable metal materials including alloys thereof. In various embodiments, the first wiring material 310 can be deposited using conventional processing techniques including: physical vapor deposition, evaporation, chemical vapor deposition, or the like; electrochemical methods such as electroplating or electrode-less deposition from a liquid medium, or the like; or other suitable deposition techniques including combinations of the above. In some embodiments, first wiring material 310 may be patterned. Additionally, one or more barrier materials/contact materials may be disposed on first wiring material 310 before or after patterning.

In some embodiments of the present invention, a conductive silicon-bearing material 320 may be disposed over the first wiring material 310. In some embodiments of the present invention, conductive material 320 may be a polysilicon, a p-type doped polysilicon, a silicon/germanium alloy or the like. Various methods may be used to dope the polysilicon, including in-situ dopants, ion implantation, and the like. The p-type dopant may be any conventional dopant in various embodiments, such as Boron, or the like. In some embodiments, the thickness of the silicon-bearing material 320 may be within the range of about 3 nm to about 10 nm, or the like. An upper region 340 and a lower region 350 are illustrated.

In some embodiments of the present invention, before conductive silicon layer 320 is formed, a thick dielectric layer, e.g. an oxide layer, may be formed above first wiring material 310. Then a series of vias are etched into the thick oxide layer to expose first wiring material 310. In such cases, the conductive silicon material 320 is formed within the via structures.

In various embodiments, after or when the conductive silicon-bearing material, e.g. doped polysilicon layer is being formed, a thin layer 330 of material may be formed on the top surface of conductive material 320. This growth may be a natural process that occurs between processing steps, or this growth may be intentional performed. In some embodiments, the thickness of the may be controlled. In other words, an etch process (e.g. HF dip, or the like) may be performed to either completely remove the layer before subsequent processes are performed, or the thickness of the layer may brought within a certain thickness range. In some embodiments, the thickness of the layer may be on the order of 0 to 50 angstroms. In some embodiments, the within the device, the thin layer 330 is an oxide, nitride, or the like.

Figure 4:
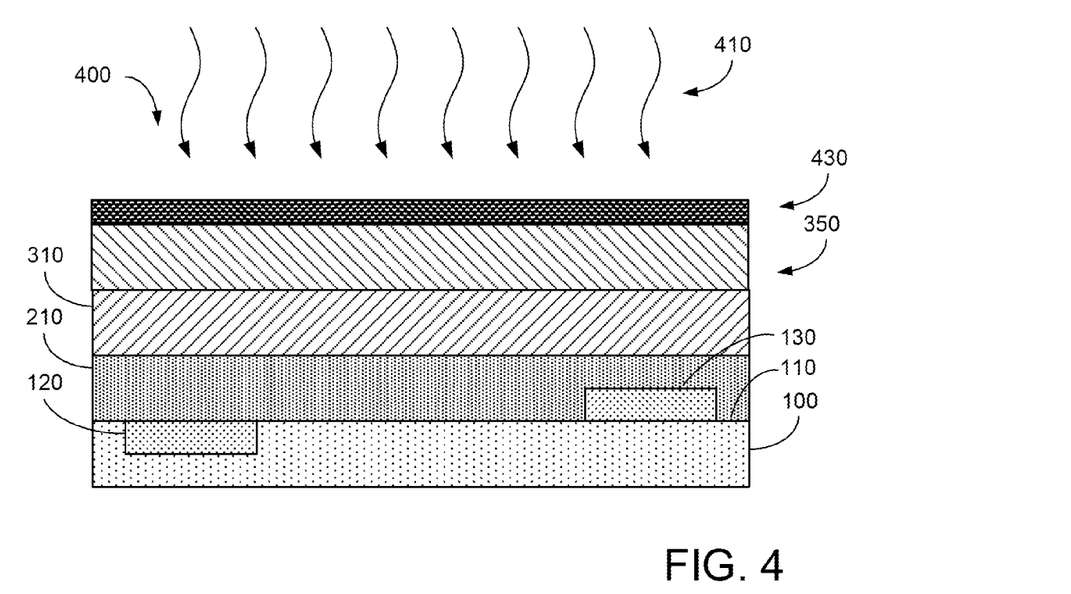
FIG. 4 illustrates a cross-section of a process step for forming a switching device according to various embodiments of the present invention.

FIG. 4 illustrates a cross-section 400 according to embodiments of the present invention. In FIG. 4, the top surface of the device illustrated in FIG. 3 is subject to an Argon gas plasma etch 410 with a bias power within a range of approximately 30 watts to approximately 120 watts. In other embodiments, the plasma etch may use oxygen, silicon, another noble gas, or the like.

In some embodiments of the present invention, an ion implantation process is performed instead of/or in addition to the plasma etch. The implantation may use Argon-ions or the like. In some embodiments, implantation energy may be within the range 10 to 200 keV.

As illustrated in FIG. 4, upper region 340 of conductive material 320 is affected by the plasma etch/ion implant. In various embodiments, it is believed that the result of the etch/implant is an amorphizing of the conductive silicon material within upper region 410. In other words, a portion of the conductive silicon material within upper region 340 is etched away, and a portion becomes non-conductive, i.e. amorphous silicon layer 430. Although amorphous silicon 430 may still include p-type dopants, the amorphous silicon is non-crystalline, and is non-conductive.

In some specific examples, when conductive material 320 is a doped polysilicon material, the amorphization process creates an amorphous SiOx material. In other specific examples, when conductive material 320 is a doped silicon-germanium material, the amorphization process creates SiOx and/or a SixGeyOz (x, y, z integers) material as the amorphous layer. In some examples, the upper region 410 may have a thickness in the range of approximately 2 nm to approximately 5 nm. In other embodiments, other thicknesses are contemplated, in light of the specific engineering requirements. As will be described below, the amorphous silicon 430 in upper region 340 serves as a resistive switching layer.

In some embodiments, where a via structure is used, conductive material 320 may be planarized with respect to a thick dielectric layer, e.g. an oxide layer, prior to the amorphizing process described above. After amorphizing, the amorphous silicon 430 is exposed for the following steps.

In some embodiments, a pillar-type structure is used. In such embodiments, the amorphous silicon 430 and the lower region 350 may be etched to form a series of pillar-type structures overlying first wiring layer 310. In such embodiments, a thick dielectric layer is formed over and between the pillar-type structures, and one or more CMP processes may be performed to expose a top surface of amorphous silicon 430 for the following steps.

In some embodiments, amorphous silicon 430 (the amorphous layer) has a thickness within the range of approximately 2 to approximately 10 nanometers, approximately 30 Angstroms to approximately 40 Angstroms, or the like depending upon specific device engineering requirements or design. In some embodiments, a thickness of lower region 350 is typically greater than a thickness of upper region 340.

In some experimental studies, where an oxide layer 330 is present, oxide layer 330 above upper region 340 disappears, and an atomic composition of amorphous silicon 430 reveals primarily silicon and oxygen. In various embodiments, amorphous silicon 430 is the switching material for this device.

Figure 5:
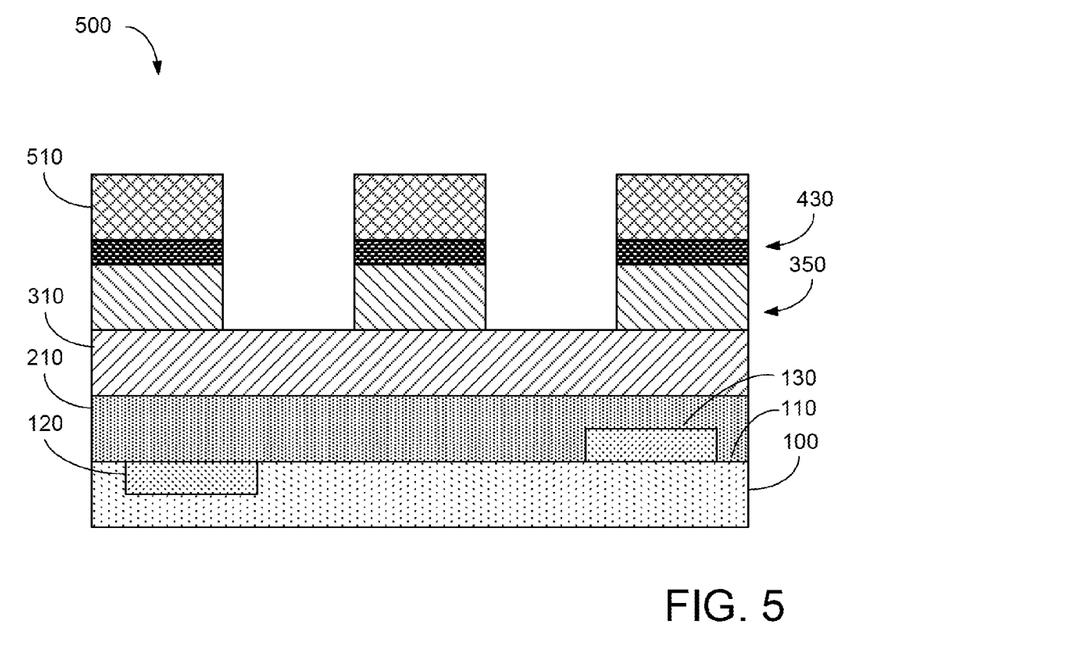
FIG. 5 illustrates a cross-section of a process step for forming a switching device according to various embodiments of the present invention.

FIG. 5 illustrates a cross-section 500 according to various embodiments of the present invention. More specifically, as illustrated in FIG. 5, a conductive material 510 is disposed above amorphous silicon 430. In a specific embodiment, for amorphous silicon switching material, conductive material 510 can comprise a silver material, and in other embodiments, materials including silver, platinum, palladium, copper or nickel, or a combination may be used for conductive material.

Conductive material 510 can be deposited using a physical deposition process such as sputtering or evaporation. Conductive material 510 (e.g. silver) may also be formed using a chemical deposition process such as chemical vapor deposition, electrochemical such as electroplating, electrodeless deposition, or a combination depending on the application.

In some embodiments, a thin layer of material may be present prior to the deposition of conductive material 510. This thin layer may be within the range of approximately 5 nm to approximately 25 Angstroms, approximately 40 A to 30 A, approximately 30 A, or the like. In some embodiments, the thin layer serves to reduce the diffusion or agglomeration of conductive material 510 (e.g. silver) into switching material 430 during fabrication of the disclosed structures. In such embodiments, as back end fabrication steps may include high temperature operations, the thin layer reduces the migration of the metallic ions into the switching material 430. In some embodiments, the thin layer also serves to restrict or control where metallic ions migrate into defect sites of switching material 1002 during operation of the device. As disclosed in co-pending U.S. patent application Ser. No. 12/894,098, filed Sep. 29, 2010, assigned to the same assignee, and incorporated by reference herein, for all purposes, during operation of the device, a thin oxide layer is used to control a conductive path from a metallic layer to the switching layer.

In various embodiments of the present invention, the thin layer may be a layer of oxide, carbon, nitride or other relative stable material. These materials may be formed via a plasma enhanced chemical vapor deposition process, an atomic layer deposition process, a spin coating process, a plasma oxidation process, a physical vapor deposition process, a naturally occurring growth, or the like. In some embodiments, the formed oxide may be subsequently etched until the desired thickness is obtained for the thin layer. In some examples, an Argon etch may be used. In some embodiments, the conductive material 510 is thus formed or deposited on top of the thin layer that is specifically grown, formed, deposited, or naturally occurring upon switching material 430.

In various embodiments, one or more barrier/contact materials may be formed overlying the conductive material 510. In some examples, barrier/contact materials protect conductive material 510 from oxidation, serve as a polish stop material in a subsequent step for a CMP process, or the like. In some embodiments, barrier/contact material can be titanium, titanium nitride, tantalum or tantalum nitride, tungsten, or tungsten nitride, or any suitable barrier material and can be formed using a chemical deposition such as atomic layer deposition, chemical vapor deposition, and others, or a physical deposition such as sputtering, depending on the application.

In a specific embodiment, an embodiment may include subjecting a stack of material comprising one or more barrier/contact materials, amorphous material 430, lower region 420, conductive material 510, and/or one or more barrier/contact materials to a patterning and etch process to form a plurality of pillar structures above first wiring material 310. The shape of the cross section shape of pillar structures may be approximately square, rectangular, circular, hexagonal, or other similar shape. Within the pillar structures, lower region 420, amorphous material 430, and conductive material 510 form the switching device. In various embodiments, the pillar structures can have a feature size of less than about 250 nm and preferably about 90 nm, or even 40 nm, depending on the technology node adopted. The first wiring layer 310 structure can have a width of about 90 nm or greater. Subsequently, in some embodiments, a thick dielectric is deposited to laterally isolate the pillar structures, and one or more planarization processes are performed to expose a top surface of conductive material 510.

Figure 6:
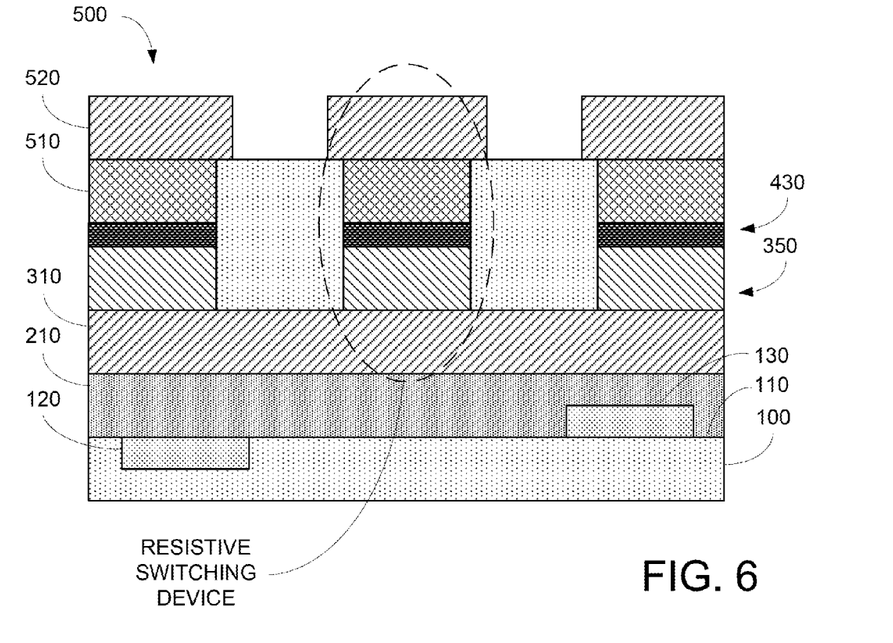
FIG. 6 illustrates a cross-section of an embodiment of the present invention.

FIG. 6 illustrates a cross-section 600 of an embodiment of the present invention. In FIG. 6, in some embodiments, a second wiring material 520 is disposed in electrical contact with conductive material 510 (sometimes with intermediary barrier/contact materials). As can be seen, the pillars of FIG. 5 are electrically isolated (e.g. by an oxide, or the like). In various embodiments, the second wiring material 520 may be tungsten, copper, aluminum or other suitable metal materials including alloys thereof. In various embodiments, the second wiring material 520 can be deposited using conventional processing techniques including: physical vapor deposition, evaporation, chemical vapor deposition, or the like; electrochemical methods such as electroplating or electrodeless deposition from a liquid medium, or the like; or other suitable deposition techniques including combinations of the above. In some embodiments, second wiring material 520 may be patterned. Additionally, one or more barrier materials/contact materials may be disposed on second wiring material 520 before or after patterning, such as tungsten.

In some embodiments, first wiring material 310 is patterned and extends in a first direction and second wiring material 520 is patterned and extends in a second direction. The first direction and the second direction are characterized by an angle between them. In some embodiments the angle may be 90 degrees, 30 degrees, or the like.

In a specific embodiment, the top wiring structure, the bottom wiring structure and the switching element sandwiched between the first wiring structure and the second wiring structure provide for a switching device for a non-volatile memory device. Of course one skilled in the art would recognize other variations, modifications, and alternatives. It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A resistive memory device comprises:
a substrate comprising a first metal material;
a monolithic semiconductor layer formed on the first metal material, wherein the monolithic semiconductor layer comprises an upper region and a lower region, wherein the lower region of the monolithic semiconductor layer comprises a conductive silicon-bearing material, and wherein the upper region of the monolithic semiconductor layer comprises an amorphous silicon-bearing material having a plurality of defect sites and comprising silicon and another material, and wherein the lower region is adjacent to the first metal material;
an active metal material disposed above the upper region; and
wherein the plurality of defects sites of the amorphous silicon-bearing material are configured to receive metallic ions from the active metal material.

2. The resistive memory device of claim 1, wherein the other material is oxygen.

3. The resistive memory device of claim 2, wherein the amorphous silicon-bearing material comprises a resistive switching material comprising the silicon and the oxygen.

4. The resistive memory device of claim 3, wherein the active metal material comprises a metal selected from a group consisting of aluminum, silver, platinum, palladium, copper, nickel, and combination thereof.

5. The resistive memory device of claim 2, wherein the upper region of the monolithic semiconductor layer has a thickness within a range of approximately 2 to approximately 3 nanometers.

6. The resistive memory device of claim 2, wherein the upper region of the monolithic semiconductor layer has a thickness within a range of approximately 2 to approximately 5 nanometers.

7. The resistive memory device of claim 2, wherein the conductive silicon-bearing material is selected from a group consisting of a polysilicon material and a silicon-germanium material; and wherein the conductive silicon-bearing material comprises a p-type dopant.

8. The resistive memory device of claim 2, wherein the first metal material comprises:
a metal selected from a group consisting of: copper and aluminum; and
a contact material disposed above the metal and selected from a group consisting of titanium, titanium nitride, tantalum, tantalum nitride, tungsten, and tungsten nitride.

9. The resistive memory device of claim 1, wherein the upper region is formed from a portion of the conductive silicon-bearing material subjected to an Argon plasma etch process.

10. The resistive memory device of claim 9, wherein the Argon plasma etch comprises an Argon plasma etch process having a voltage within a range of approximately 30 volts to approximately 20 volts.

11. A semiconductor device comprises:
a semiconductor substrate;
at least one CMOS device formed upon the semiconductor substrate;
a first dielectric layer disposed above the at least one CMOS device;
a first wiring layer disposed above the first dielectric layer, wherein the first wiring layer is coupled to a CMOS device of the at least one CMOS device, wherein the first wiring layer comprises a first metal material;
a monolithic semiconductor layer disposed on the first wiring layer and comprising a conductive silicon-bearing material, wherein the monolithic semiconductor layer comprises an upper region and a lower region, wherein the lower region of the monolithic semiconductor layer comprises the conductive silicon-bearing material and the upper region of the monolithic semiconductor layer comprises an amorphous silicon-bearing material having a plurality of defect sites and comprising silicon and another material, and wherein the lower region is adjacent to the first wiring layer;

an active metal layer disposed above the upper region of the monolithic semiconductor layer, wherein the plurality of defects sites of the amorphous silicon-bearing material are configured to receive metallic ions from the active metal material; and a second wiring layer disposed above the active metal layer;

wherein a resistive memory device is formed from the monolithic semiconductor layer and the active metal layer.

12. The semiconductor device of claim 11 wherein the other material is oxygen.

13. The semiconductor device of claim 12, wherein the amorphous silicon-bearing material comprises a resistive switching material having the silicon and the oxygen.

14. The semiconductor device of claim 13, wherein the active metal layer is configured to provide metallic ions; and wherein the amorphous silicon-bearing material comprises a resistive switching material that includes metallic ions from the active metal layer.

15. The semiconductor device of claim 14, wherein the metallic ions from the active metal layer within the resistive switching material forms a controlled conductive path through the resistive switching material.

16. The semiconductor device of claim 13, wherein the active metal material comprises a metal selected from a group consisting of aluminum, silver, platinum, palladium, copper, and nickel.

17. The semiconductor device of claim 12, wherein the at least one CMOS device forms at least one device selected from a group consisting of processing logic, computational logic, memory, and a driver for the resistive memory device.

18. The semiconductor device of claim 12,
wherein the conductive silicon-bearing material is selected from a group consisting of a polysilicon material and a silicon-germanium material; and
wherein the conductive silicon-bearing material comprises a p-type dopant.

19. The semiconductor device of claim 12, wherein the first wiring layer comprises:
a metal selected from a group consisting of copper and aluminum; and
a contact material disposed above the metal and selected from another group consisting of titanium, titanium nitride, tantalum, tantalum nitride, tungsten, and tungsten nitride.

20. The semiconductor device of claim 11, wherein the upper region is formed from a portion of the conductive silicon-bearing material subjected to a plasma etch or ion implantation that includes a gas selected from a group consisting of argon, silicon and oxygen.

* * * * *